United States Patent
Lee et al.

(10) Patent No.: US 9,698,167 B2
(45) Date of Patent: Jul. 4, 2017

(54) FILM TRANSISTOR ARRAY PANEL AND MANUFACTURING METHOD THEREOF

(71) Applicant: Samsung Display Co., Ltd., Yongin, Gyeonggi-do (KR)

(72) Inventors: Doo Youl Lee, Seoul (KR); Hyuk Soon Kwon, Suwon-si (KR); Jang Soo Kim, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 105 days.

(21) Appl. No.: 14/534,508

(22) Filed: Nov. 6, 2014

(65) Prior Publication Data
US 2016/0020230 A1    Jan. 21, 2016

(30) Foreign Application Priority Data

Jul. 15, 2014 (KR) .................. 10-2014-0089199

(51) Int. Cl.
*H01L 27/12* (2006.01)
*H01L 29/786* (2006.01)

(52) U.S. Cl.
CPC ........ *H01L 27/1225* (2013.01); *H01L 27/127* (2013.01); *H01L 27/1233* (2013.01); *H01L 27/1288* (2013.01)

(58) Field of Classification Search
CPC ............. H01L 27/1225; H01L 27/1233; H01L 27/127; H01L 27/1288; H01L 27/1214; H01L 27/1222; H01L 27/1259
See application file for complete search history.

(56) References Cited

U.S. PATENT DOCUMENTS

| 8,263,443 B2 | 9/2012 | Yoshino et al. |
| 2011/0012105 A1* | 1/2011 | Yamazaki ........... H01L 27/1251 257/43 |
| 2015/0380563 A1* | 12/2015 | Park .................. H01L 29/78606 257/43 |

FOREIGN PATENT DOCUMENTS

| JP | 05-095133 | 4/1993 |
| JP | 3173747 | 3/2001 |
| KR | 100573108 | 4/2006 |
| KR | 100590250 | 6/2006 |
| KR | 1020110062102 A | 6/2011 |
| WO | 2012-091297 A1 | 5/2012 |

* cited by examiner

*Primary Examiner* — Zandra Smith
*Assistant Examiner* — Molly Reida
(74) *Attorney, Agent, or Firm* — Robert E. Bushnell, Esq.

(57) ABSTRACT

Disclosed is a thin film transistor array panel including: a substrate including a display area and a peripheral area; a second semiconductor layer disposed on the substrate, and disposed on a first semiconductor layer disposed in the display area and the peripheral area; and a passivation layer disposed on the first semiconductor layer and the second semiconductor layer, wherein the first semiconductor layer and the second semiconductor layer include an oxide semiconductor, and a thickness of the first semiconductor layer is different from that of the second semiconductor layer.

14 Claims, 13 Drawing Sheets

FILM TRANSISTOR ARRAY PANEL AND MANUFACTURING METHOD THEREOF

CLAIM OF PRIORITY

This application claims priority to and all the benefits under 35 U.S.C. §119(a) of Korean Patent Application No. 10-2014-0089199 filed in the Korean Intellectual Property Office on Jul. 15, 2014, the entire contents of which are incorporated herein by reference.

BACKGROUND OF THE INVENTION

Field of the Invention

The present invention relates to a thin film transistor array panel and a manufacturing method thereof.

Description of the Related Art

A flat panel display, such as a liquid crystal display (LCD), an organic light emitting diode (OLED) display, an electrophoretic display, and a plasma display, includes a plurality of pairs of field generating electrodes, with an electro-optical active layer therebetween. The LCD includes a liquid crystal layer as the electro-optical active layer, and the OLED display includes an organic emission layer as the electro-optical active layer. One of the pair of field generating electrodes is generally connected to a switching element to receive an electric signal, and the electro-optical active layer converts the electric signal into an optical signal to display an image.

A display panel with the thin film transistor may be included in the flat panel display. Electrodes of many layers, a semiconductor, and the like are patterned on the thin film transistor array panel, in other words the patterned elements are for producing the thin film transistor array panel, and generally, a mask is used during a patterning process.

Meanwhile, the semiconductor is an important factor to determine a characteristic of the thin film transistor. In such a semiconductor, amorphous silicon is frequently used, but there is a limit to manufacture a high-performance thin film transistor due to low charge mobility. Further, in the case of using polysilicon, due to high charge mobility, the high-performance thin film transistor is easily manufactured, but there is a limit to manufacture a large-sized thin film transistor array panel due to high cost and low uniformity.

Accordingly, researches for a thin film transistor using an oxide semiconductor, which has higher electron mobility and a higher ON/OFF rate of current than amorphous silicon, and has a lower cost and higher uniformity than polysilicon, have been conducted.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a thin film transistor array panel having an oxide semiconductor layer of which thickness is variable according to a panel region, and a manufacturing method thereof.

An exemplary embodiment of the present invention provides a thin film transistor array panel including: a substrate including a display area and a peripheral area; a first semiconductor layer disposed in the display area and a second semiconductor layer disposed on the peripheral area; and a passivation layer disposed on the first semiconductor layer and the second semiconductor layer, wherein the first semiconductor layer and the second semiconductor layer include an oxide semiconductor, and a thickness of the first semiconductor layer is different from that of the second semiconductor layer.

The second semiconductor layer is disposed on a gate driver area of the peripheral area.

The second semiconductor layer includes a lower semiconductor layer and an upper semiconductor layer disposed on the lower semiconductor layer.

The first semiconductor layer and the upper semiconductor layer of the second semiconductor layer are disposed as a same layer.

The first semiconductor layer and the second semiconductor layer are formed with an oxide semiconductor including at least one of indium, gallium, and zinc.

The thin film transistor array panel further includes a first gate electrode disposed on the substrate in the display area, and a first source electrode and a first drain electrode facing each other with respect to the first gate electrode, wherein the first semiconductor layer is disposed between the first gate electrode and the first source electrode or between the first gate electrode and the first drain electrode.

The thin film transistor array panel further includes a second gate electrode disposed on the substrate in the peripheral area, and a second source electrode and a second drain electrode facing each other with respect to the second gate electrode, wherein the second semiconductor layer is disposed between the second gate electrode and the second source electrode or between the second gate electrode and the second drain electrode.

Another embodiment of the present invention provides a thin film transistor array panel including: a substrate including a display area and a peripheral area; a first semiconductor layer disposed in the display area and a second semiconductor layer disposed on the peripheral area; and a passivation layer disposed on the first semiconductor layer and the second semiconductor layer, wherein the first semiconductor layer and the second semiconductor layer includes an oxide semiconductor, a thickness of the first semiconductor layer is the same as that of the second semiconductor layer, and the first semiconductor layer is plasma-processed to have a semiconductor property that is different from that of the second semiconductor layer.

The first semiconductor layer and the second semiconductor layer are disposed as a same layer.

The second semiconductor layer is disposed on a gate driver area of the peripheral area.

The first semiconductor layer and the second semiconductor layer are formed with an oxide semiconductor including at least one of indium, gallium, and zinc.

Yet another embodiment of the present invention provides a method for manufacturing a thin film transistor array panel, including: forming a first semiconductor layer in a display area and a second semiconductor layer in a peripheral area on a substrate including the display area and the peripheral area; and forming a passivation layer on the first semiconductor layer and the second semiconductor layer, wherein the first semiconductor layer and the second semiconductor layer are formed with an oxide semiconductor, and a thickness of the first semiconductor layer is formed to be different from that of the second semiconductor layer.

The method further includes: disposing a shadow mask to correspond to the display area on the substrate; forming a lower semiconductor material layer in the peripheral area while the shadow mask is disposed; removing the shadow mask; forming an upper semiconductor material layer on the lower semiconductor material layer in the peripheral area and forming a first semiconductor material layer in the display area while the shadow mask is removed; and forming the first semiconductor layer and the second semiconductor layer by patterning the first semiconductor material layer, the upper semiconductor material layer, and the lower semiconductor material layer.

The second semiconductor layer is formed on a gate driver of the peripheral area.

The first semiconductor layer and the upper semiconductor layer of the second semiconductor layer are formed as a same layer.

The forming of a first semiconductor layer and a second semiconductor layer includes: forming the semiconductor material layer with a same thickness in the display area and the peripheral area on the substrate; and forming the first semiconductor layer and the second semiconductor layer having different thicknesses by etching the semiconductor material layer.

The second semiconductor layer is formed on a gate driver of the peripheral area.

The first semiconductor layer and the second semiconductor layer are formed with an oxide semiconductor including at least one of indium, gallium, and zinc.

According to the exemplary embodiments of the present invention, dispersion of the threshold voltage (Vth) of the thin film transistor disposed in the display area is reduced and degradation of the thin film transistor disposed in the peripheral area is prevented by differently forming the thickness of the oxide semiconductor layer disposed in the display area and the peripheral area.

DETAILED DESCRIPTION OF THE INVENTION

Figure 1:
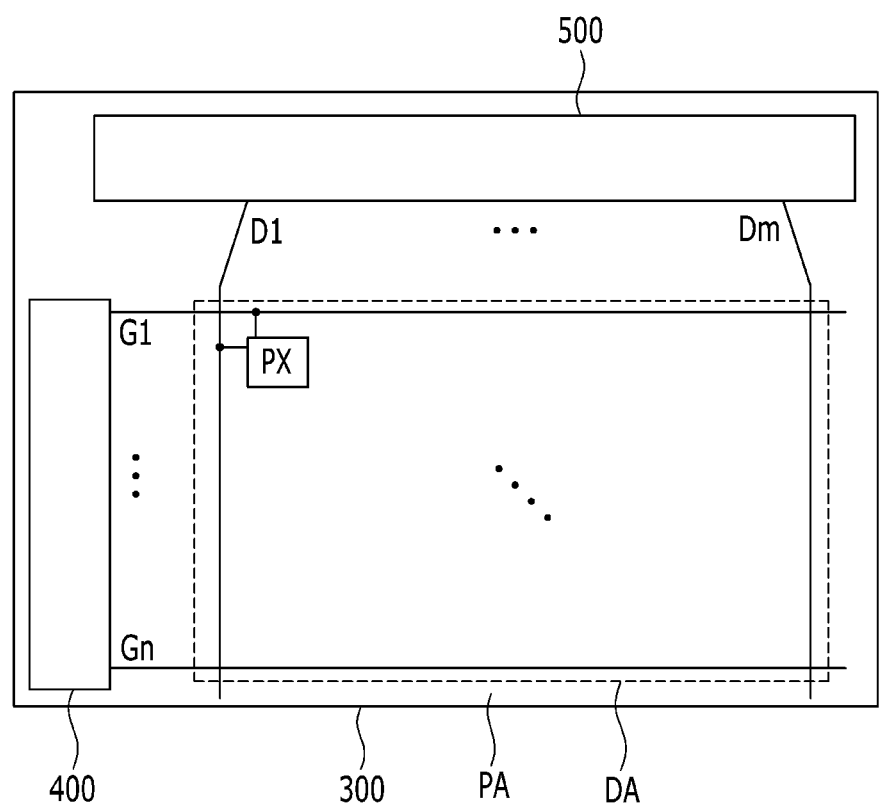
FIG. 1 shows a block diagram of a thin film transistor array panel according to an exemplary embodiment of the present invention.

The present invention will be described more fully hereinafter with reference to the accompanying drawings, in which exemplary embodiments of the invention are shown. However, it is to be understood that the invention is not limited to the disclosed embodiments, but, on the contrary, is intended to cover various modifications. As those skilled in the art would realize, the described embodiments may be modified in various different ways, all without departing from the spirit or scope of the present invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

A display area (DA) of a thin film transistor array panel according to an exemplary embodiment of the present invention will now be described with reference to FIG. 1 to FIG. 3.

FIG. 1 shows a block diagram of a thin film transistor array panel according to an exemplary embodiment of the present invention. FIG. 2 shows a top plan view of a thin film transistor array panel disposed in a display area (DA) of FIG. 1. FIG. 3 shows a cross-sectional view with respect to a line III-III of FIG. 2.

Referring to FIG. 1, the thin film transistor array panel includes a display panel 300, a gate driver 400, and a data driver 500.

The display panel 300 includes a plurality of gate lines (G1-Gn), a plurality of data lines (D1-Dm), and a plurality of pixels PX connected to the gate lines (G1-Gn) and the data lines (D1-Dm). The display panel 300 includes a display area (DA) in which the pixels PX are arranged, and a peripheral area (PA) disposed near the display area (DA). The gate lines (G1-Gn) transmit a gate signal and the data lines (D1-Dm) transmit a data voltage. Each pixel PX includes a switching element connected to one of the gate lines (G1-Gn) and one of the data lines (D1-Dm), and a pixel electrode. The switching element can be a three-terminal element such as a thin film transistor integrated on the display panel 300.

The data driver 500 is connected to the data lines (D1-Dm) and transmits a data voltage. The data driver 500 can be disposed in the peripheral area (PA) of the display panel 300, it can be integrated in the peripheral area (PA) in a same manufacturing process as for the switching element including the pixel PX, and differing from FIG. 1, it can be disposed on a flexible printed circuit film attached to the display panel 300.

The gate driver 400 is integrated in the peripheral area (PA) of the display panel 300, and sequentially transmits the gate signal to the gate lines (G1-Gn). The gate signal includes a gate-on voltage Von and a gate-off voltage Voff.

The gate driver 400 receives a scanning start signal for instructing an output start of a gate-on pulse, and a gate clock signal for controlling an output time of the gate-on pulse so as to sequentially drive the gate lines (G1-Gn). Signal lines for applying the signals to the gate driver 400 are disposed in the peripheral area (PA) of the display panel 300.

The display panel 300, the gate driver 400, and the data driver 500 included by the thin film transistor array panel according to an exemplary embodiment of the present invention, and other various electrical constituent elements included by the thin film transistor array panel, can include a plurality of electrical elements including a plurality of transistors, a plurality of capacitors, and a plurality of diodes.

Figure 2:
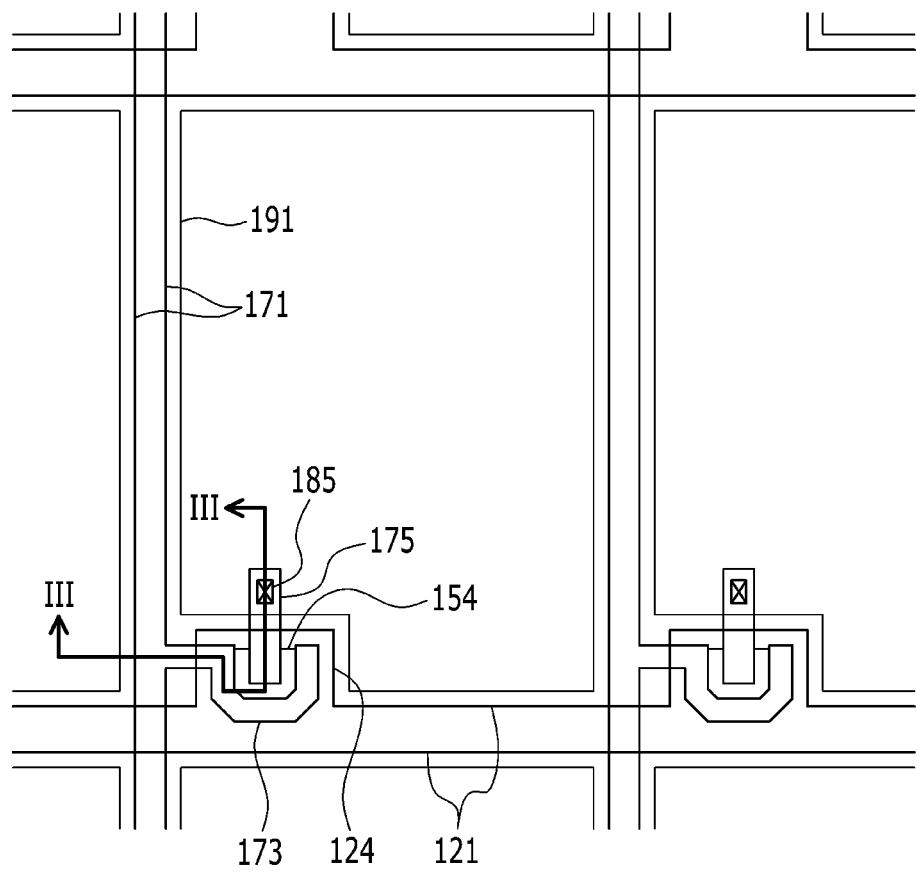
FIG. 2 shows a top plan view of a display area (DA) of a thin film transistor array panel of FIG. 1.
Figure 3:
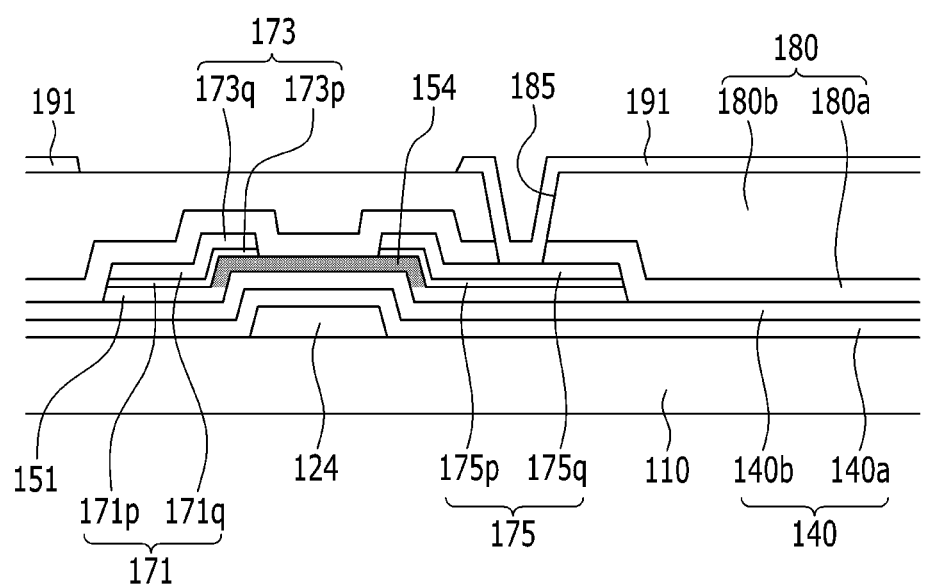
FIG. 3 shows a cross-sectional view with respect to a line III-III of FIG. 2.

Referring to FIG. 2 and FIG. 3, the thin film transistor array panel disposed in the display area (DA) includes a plurality of gate lines 121 formed on a substrate 110 made of transparent glass or plastic.

The gate line 121 transmits a gate signal and is mainly extended in a horizontal direction. Each gate line 121 includes a plurality of first gate electrodes 124 protruded from the gate line 121.

The gate line 121 and the first gate electrode 124 can be formed of an aluminum-based metal including aluminum (Al) and an aluminum alloy, a silver-based metal including silver (Ag) and a silver alloy, a copper-based metal including copper (Cu) and a copper alloy, a molybdenum-based metal including molybdenum (Mo) and a molybdenum alloy, chromium (Cr), titanium (Ti), tantalum (Ta), and manganese (Mn). The gate line 121 and the first gate electrode 124 have been described to be formed as single layers in the present exemplary embodiment, and without being restricted to this, they can be formed to have dual layers or triple layers.

A gate insulating layer 140 made of an insulating material such as a silicon oxide or a silicon nitride is disposed on the gate line 121. The gate insulating layer 140 includes a first insulating layer 140a and a second insulating layer 140b. The first insulating layer 140a can be formed to be an about 4000 Å thick silicon nitride ($SiN_x$), and the second insulating layer can be formed to be an about 500 Å thick silicon oxide ($SiO_x$). As another exemplary embodiment, the first insulating layer 140a can be formed to be a silicon oxynitride ($SiO_xN_y$), and the second insulating layer 140b can be formed to be a silicon oxide ($SiO_x$). The gate insulating layers 140a and 140b have been described to be formed as dual layers in the present exemplary embodiment, and they can also be formed to be single layers.

A plurality of first semiconductor layers 151 are formed on the gate insulating layer 140. The first semiconductor layer 151 can be formed with amorphous silicon, crystallized silicon, or an oxide semiconductor. In FIG. 2, the first semiconductor layer 151 is mainly extended in the vertical direction, i.e. parallel to the lengthwise direction of the data line 171, and includes a plurality of projections 154 (highlighted in gray merely to indicate the region of 154 in FIG. 3) extended toward the gate electrode 124.

When the first semiconductor layer 151 is formed with an oxide semiconductor, the first semiconductor layer 151 includes at least one of zinc (Zn), indium (In), tin (Sn), gallium (Ga), and hafnium (Hf). Particularly, the first semiconductor layer 151 can be an indium-gallium-zinc oxide.

A data wire layer including a plurality of data lines 171, a plurality of first source electrodes 173 connected to the data lines 171, and a plurality of first drain electrodes 175 is formed on the first semiconductor layer 151 and the gate insulating layer 140.

The data line 171 transmits a data signal and it is mainly extended in the vertical direction to cross the gate line 121. The first source electrode 173 is extended from the data line 171 to overlap the first gate electrode 124, and in top plan view, it can have a substantially U shape.

The first drain electrode 175 is separated from the data line 171, and it is extended upward from the center of the U shape of the first source electrode 173.

The data line 171, the first source electrode 173, and the first drain electrode 175 can have a dual-layer structure of barrier layers 171p, 173p, and 175p, and main wiring layers 171q, 173q, and 175q. The barrier layers 171p, 173p, and 175p are formed with a metal oxide, and the main wiring layers 171q, 173q, and 175q are formed with copper or a copper alloy.

In detail, the barrier layers 171p, 173p, and 175p can be formed with one of an indium-zinc oxide, a gallium-zinc oxide, and an aluminum-zinc oxide.

The barrier layers 171p, 173p, and 175p function as a spread blocking layer for preventing materials such as copper from spreading to the first semiconductor layer 151.

Referring to FIG. 3, a portion of the projection 154 (highlighted in gray merely to indicate the region of 154 in FIG. 3) of the first semiconductor layer 151 that is exposed and not covered by the data line 171 and the first drain electrode 175 is disposed between the first source electrode 173 and the first drain electrode 175. The first semiconductor layer 151 can have a substantially same plane pattern as the data line 171 and the first drain electrode 175 except at the exposed portion of the projection 154. In other words, an edge side of the first semiconductor layer 151 can substantially correspond to that of the data line 171 and first drain electrode 175 except at the exposed portion of the projection 154.

A first gate electrode 124, a first source electrode 173, and a first drain electrode 175 form a thin film transistor (TFT) together with the projection 154 of the first semiconductor layer 151, and a channel region of the thin film transistor is formed on the projection 154 between the first source electrode 173 and the first drain electrode 175.

A passivation layer 180 is formed on the main wiring layers 171q, 173q, and 175q. The passivation layer 180 is made of an inorganic insulator, an organic insulator, or a low dielectric insulator such as a silicon nitride or a silicon oxide.

The passivation layer 180 can include a lower passivation layer 180a and an upper passivation layer 180b. The lower passivation layer 180a is formed with a silicon oxide and the upper passivation layer 180b is formed with a silicon nitride. The first semiconductor layer 151 includes an oxide semiconductor so it is desirable for the semiconductor layer 151 and the adjacent lower passivation layer 180a to be formed with a silicon oxide. When the lower passivation layer 180a is formed with a silicon nitride, a characteristic of the thin film transistor is not clearly shown.

The passivation layer 180 can contact the portion that is exposed and not covered by the first source electrode 173 and the first drain electrode 175 between the first source electrode 173 and the first drain electrode 175.

A plurality of contact holes 185 for revealing an end of the first drain electrode 175 are formed in the passivation layer 180.

A plurality of pixel electrodes 191 are formed on the passivation layer 180. The pixel electrode 191 is physically and electrically connected to the first drain electrode 175 through the contact hole 185, and receives a data voltage from the first drain electrode 175.

The pixel electrode 191 can be made of a transparent conductor such as ITO or IZO.

A peripheral area (PA) of a thin film transistor array panel according to an exemplary embodiment of the present invention will now be described with reference to FIG. 1, FIG. 4, and FIG. 5.

Figure 4:
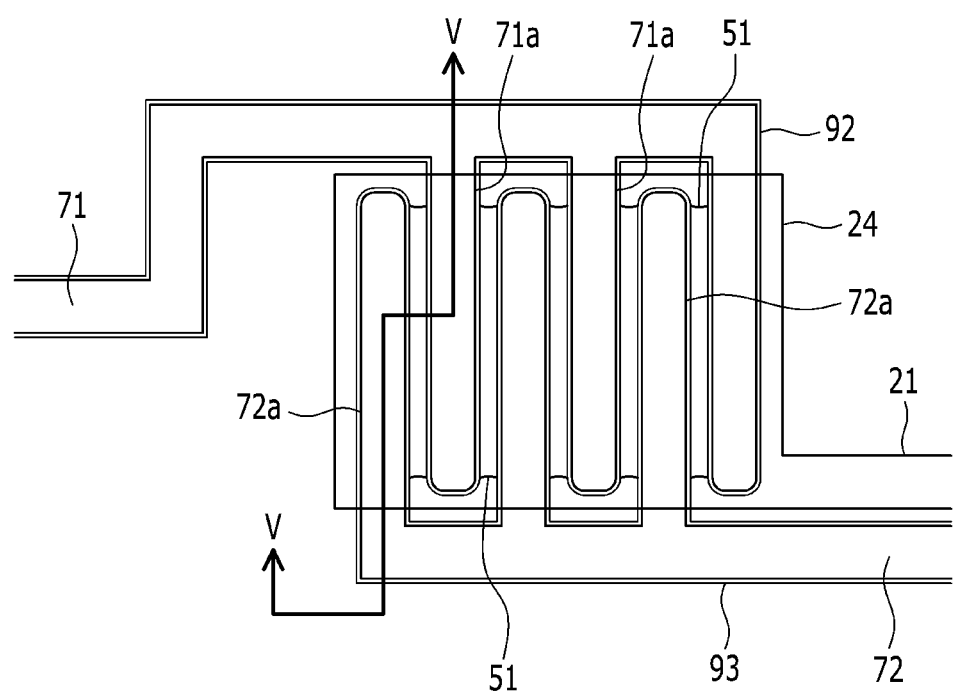
FIG. 4 shows a layout view of a driving transistor of a driver of a thin film transistor array panel disposed in a peripheral area (PA) of FIG. 1.

FIG. 4 shows a layout view of a driving transistor of a driver of a thin film transistor array panel disposed in a peripheral area (PA) of FIG. 1. FIG. 5 shows a cross-sectional view with respect to a line V-V of FIG. 4. FIG. 4 can show a driving transistor of a gate driver 400 of FIG. 1.

Figure 5:
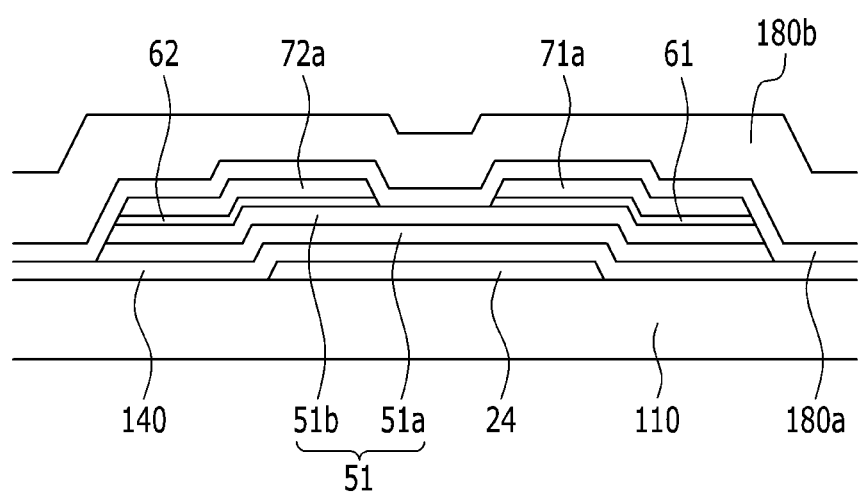
FIG. 5 shows a cross-sectional view with respect to a line V-V of FIG. 4.

Referring to FIG. 4 and FIG. 5, a drive control signal line 21 is formed on the substrate 110. The drive control signal line 21 includes a drive control electrode 24 corresponding to the second gate electrode.

The drive control signal line 21 is simultaneously formed as the same layer as the gate line 121.

A gate insulating layer 140 is disposed on the drive control signal line 21 and the drive control electrode 24. A drive semiconductor layer 51 corresponding to the second semiconductor layer is disposed on the gate insulating layer 140. The drive semiconductor layer 51 can be formed with amorphous silicon, crystallized silicon, or an oxide semiconductor. It is desirable to form the drive semiconductor layer 51 with an oxide semiconductor in the present exemplary embodiment. In this instance, the drive semiconductor layer 51 includes a lower semiconductor layer 51a and an upper semiconductor layer 51b disposed on the lower semiconductor layer 51a. The upper semiconductor layer 51b can be simultaneously formed as the same layer as the first semiconductor layer 151. Also, the drive semiconductor layer 51 can be formed with a same material as the first semiconductor layer 151.

The drive semiconductor layer 51 of the thin film transistor formed on the gate driver 400 is formed to include the lower semiconductor layer 51a and the upper semiconductor layer 51b so it can be formed to be thicker than the first semiconductor layer 151 of the thin film transistor formed in the display area (DA).

When a voltage between a source electrode and a drain electrode in the thin film transistor disposed on the gate driver 400 is high, at about 60 V, the transistor may be degraded. Therefore, an electric field can be lowered by thickening the semiconductor layer of the thin film transistor disposed on the gate driver 400.

However, the thin film transistor disposed in the display area (DA) can function as a switching element, and when the semiconductor layer of the thin film transistor is thickened, a value of a threshold voltage (Vth) shifts in a negative manner according to its initial characteristic so it becomes difficult to control dispersion of the threshold voltage.

Resultantly, thickness conditions of the semiconductor layer required for the respective regions, i.e. the display area (DA) and the peripheral area (PA), of the thin film transistor array panel are different. The semiconductor layer of the thin film transistor disposed in the display area (DA) is formed to be thinner than the semiconductor layer of the thin film transistor of the gate driver 400, thereby reducing dispersion of the threshold voltage.

A third bather layer 61 and a fourth bather layer 62 are formed on the drive semiconductor layer 51.

A drive input signal line 71 including a drive input electrode 71a corresponding to a second source electrode (not shown) and a drive output signal line 72 including a drive output electrode 72a corresponding to a second drain electrode (not shown) are formed on the third barrier layer 61 and the fourth barrier layer 62.

The drive input signal line 71, the drive output signal line 72, the drive semiconductor layer 51, the third barrier layer 61, and the fourth barrier layer 62 can be simultaneously formed by using a mask. Further, the drive input signal line 71 and the drive output signal line 72 can be simultaneously formed as the same layer as the data line 171 and the first drain electrode 175.

A lower passivation layer 180a and an upper passivation layer 180b are sequentially formed on the drive input electrode 71a and the drive output electrode 72a.

The drive semiconductor layer 51, the third barrier layer 61, the fourth barrier layer 62, the drive input line 71, and the drive output line 72 can be formed by using an exposure mask according to a photolithography process. The drive semiconductor layer 51 has substantially the same plane shape as the drive input line 71, the drive output line 72, the third barrier layer 61, and the fourth barrier layer 62.

A method for manufacturing a thin film transistor array panel according to an exemplary embodiment of the present invention will now be described with reference to FIG. 6 and FIG. 7.

Figure 6:
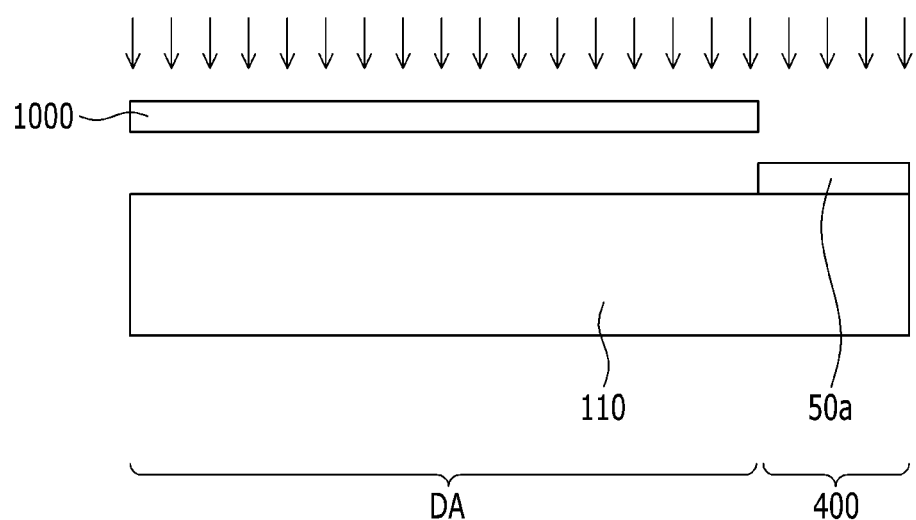
FIG. 6 and FIG. 7 show cross-sectional views of a method for manufacturing a thin film transistor array panel of the present invention.
Figure 7:
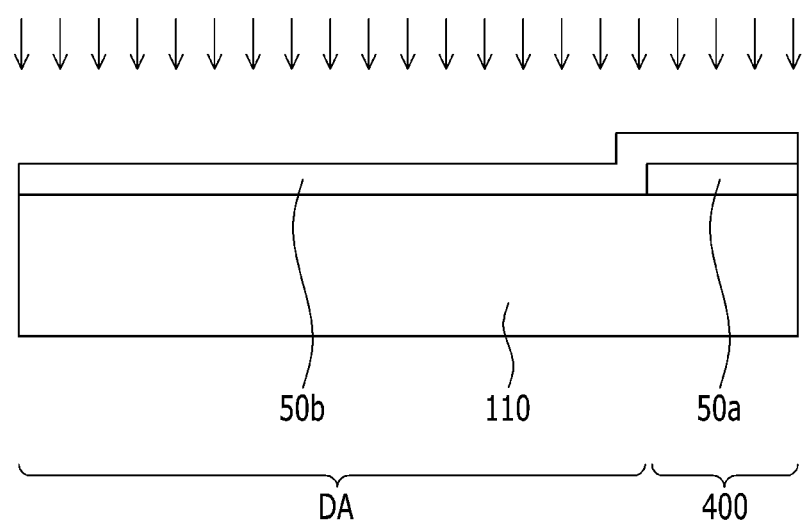

FIG. 6 and FIG. 7 show cross-sectional views of a method for manufacturing a thin film transistor array panel according to an exemplary embodiment of the present invention.

Referring to FIG. 1 to FIG. 5, a gate line 121, a first gate electrode 124, a drive control signal line 21, and a drive control electrode 24 are formed on the substrate 110. A gate insulating layer 140 is formed thereon.

A process for forming a semiconductor layer while omitting other constituent elements will be described with reference to FIG. 6 and FIG. 7.

Referring to FIG. 6, a shadow mask 1000 is disposed on the substrate 110 corresponding to the display area (DA). A lower semiconductor material layer 50a is formed in the gate driver 400 by using a sputtering method.

Referring to FIG. 7, the shadow mask 1000 is removed, and an upper semiconductor material layer 50b for covering the lower semiconductor material layer 50a formed on the substrate area where the gate driver 400 is formed. In this instance, a semiconductor material layer is formed on the substrate 110 corresponding to the display area (DA) according to the sputtering method when the shadow mask 1000 is removed.

A first semiconductor layer 151 and a second semiconductor layer corresponding to a drive semiconductor layer 51 are formed as shown in FIG. 3 and FIG. 5 through a patterning process so as to form a semiconductor layer of the thin film transistor disposed in the display area (DA) and the gate driver 400.

The sputtering method using a shadow mask is used in FIG. 6 and FIG. 7 so that the thickness of the semiconductor layer may be different for respective regions, and without being restricted to this, they can be deposited with the same thickness without using a mask and their thicknesses may be controlled to be different in the etching process.

A configuration formed by depositing the semiconductor material layer with the same thickness without using a shadow mask, and controlling the semiconductor layers for regions to have different thicknesses according to an etching process, will now be described with reference to FIG. 8.

Figure 8:
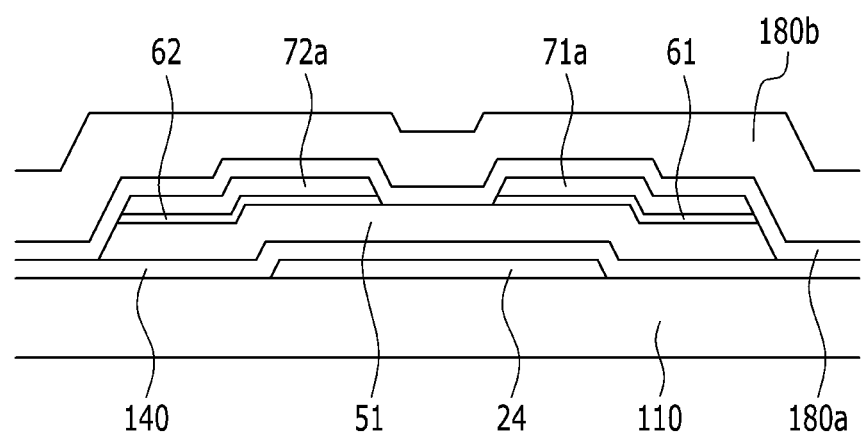
FIG. 8 shows a cross-sectional view of an exemplary variation of a structure of a second semiconductor layer described with reference to FIG. 5.

FIG. 8 shows a cross-sectional view of an exemplary variation of a structure of a second semiconductor layer described with reference to FIG. 5.

The exemplary embodiment described with reference to FIG. 8 is mostly the same as the exemplary embodiment described with reference to FIG. 5. A different configuration will be described hereinafter.

Referring to FIG. 8, a drive semiconductor layer 51 corresponding to the second semiconductor layer in the peripheral area (PA) is formed to be a single layer. In this instance, the drive semiconductor layer 51 is formed to be thicker than the first semiconductor layer 151 formed in the display area (DA). The semiconductor material layer is deposited with the same thickness in the display area (DA) and the gate driver 400, and the semiconductor material layer disposed in the display area (DA) is formed to be relatively thin through the subsequent etching process. Therefore, the first semiconductor layer 151 disposed in the display area (DA) is thin and the second semiconductor layer corresponding to the drive semiconductor layer 51 disposed in the gate driver 400 is formed to be relatively thick.

In addition to be above-described difference, the contents described with reference to FIG. 1 to FIG. 5 are applicable to the present exemplary embodiment.

Figure 9:
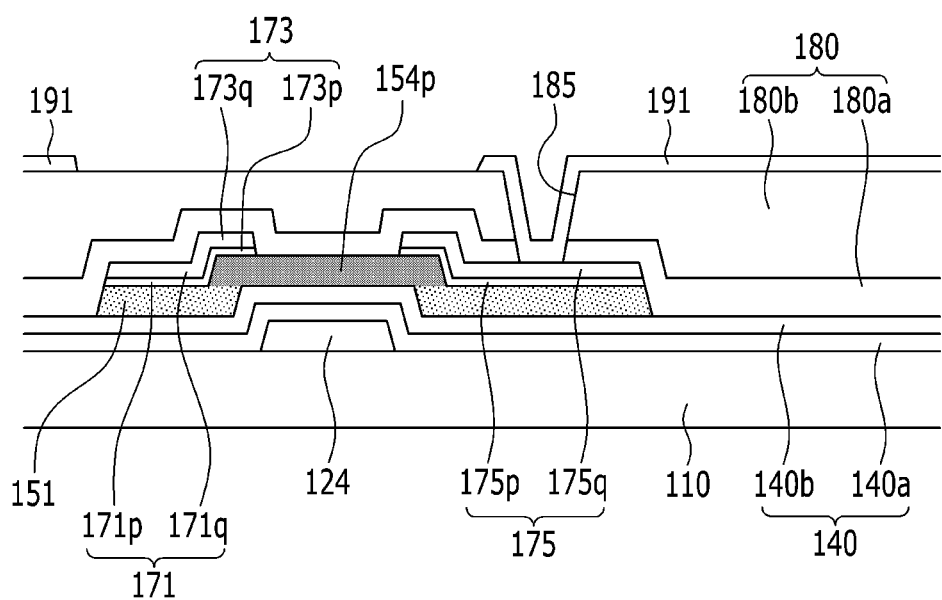
FIG. 9 and FIG. 10 show cross-sectional views of a thin film transistor array panel in a display area (DA) and a peripheral area (PA), respectively, according to another exemplary embodiment of the present invention.
Figure 10:
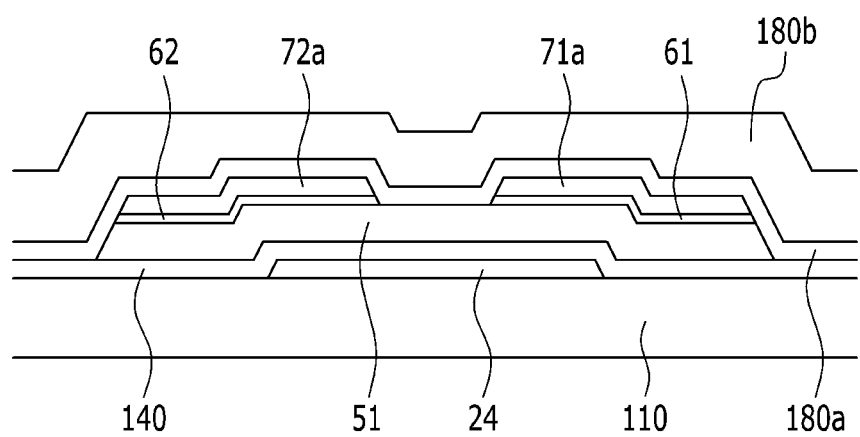

FIG. 9 and FIG. 10 show cross-sectional views of a thin film transistor array panel in a display area (DA) and a peripheral area (PA), respectively, according to an exemplary embodiment of the present invention.

Referring to FIG. 9 and FIG. 10, differing from the above-described exemplary embodiments, the first semiconductor layer 151 in the display area (DA) and the second semiconductor layer corresponding to the drive semiconductor layer 51 on the gate driver 400 in the peripheral area (PA) have a same thickness. The second semiconductor layer corresponding to the drive semiconductor layer 51 is formed to be thick so that the thin film transistor of the gate driver 400 may not be degraded. However, the property of the first semiconductor layer 151 having projection 154p (highlighted in gray merely to indicate the region of 154p in FIG. 9) is formed to be different from the second semiconductor layer corresponding to the drive semiconductor layer 51 according to a $N_2O$ plasma process. When the $N_2O$ plasma process is applied to the first semiconductor layer 151, an insulating characteristic is increased to increase the thickness of the first semiconductor layer 151 and reduce the effect due to increased channel volume. Accordingly, the thin film transistor for generating a similar effect of formation of a thin film transistor can be formed by not differentiating the thicknesses of the first semiconductor layer 151 and the second semiconductor layer corresponding to the drive semiconductor layer 51.

Figure 11A:
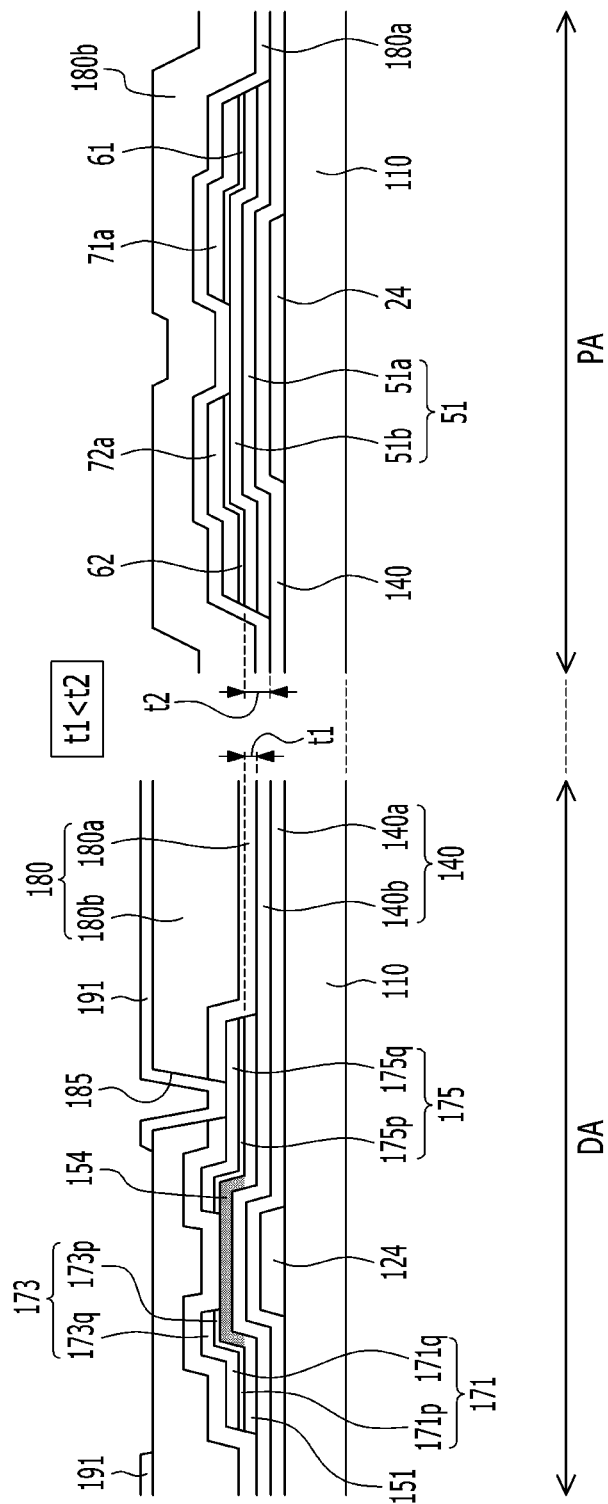
FIG. 11a shows the thin film transistor panel having the transistor disposed in the display area (DA) shown in FIG. 3 and the transistor disposed in the peripheral area (PA) shown in FIG. 5, in which a thickness $t_1$ of the first semiconductor layer is less than a thickness $t_2$ of the second semiconductor layer.
Figure 11B:
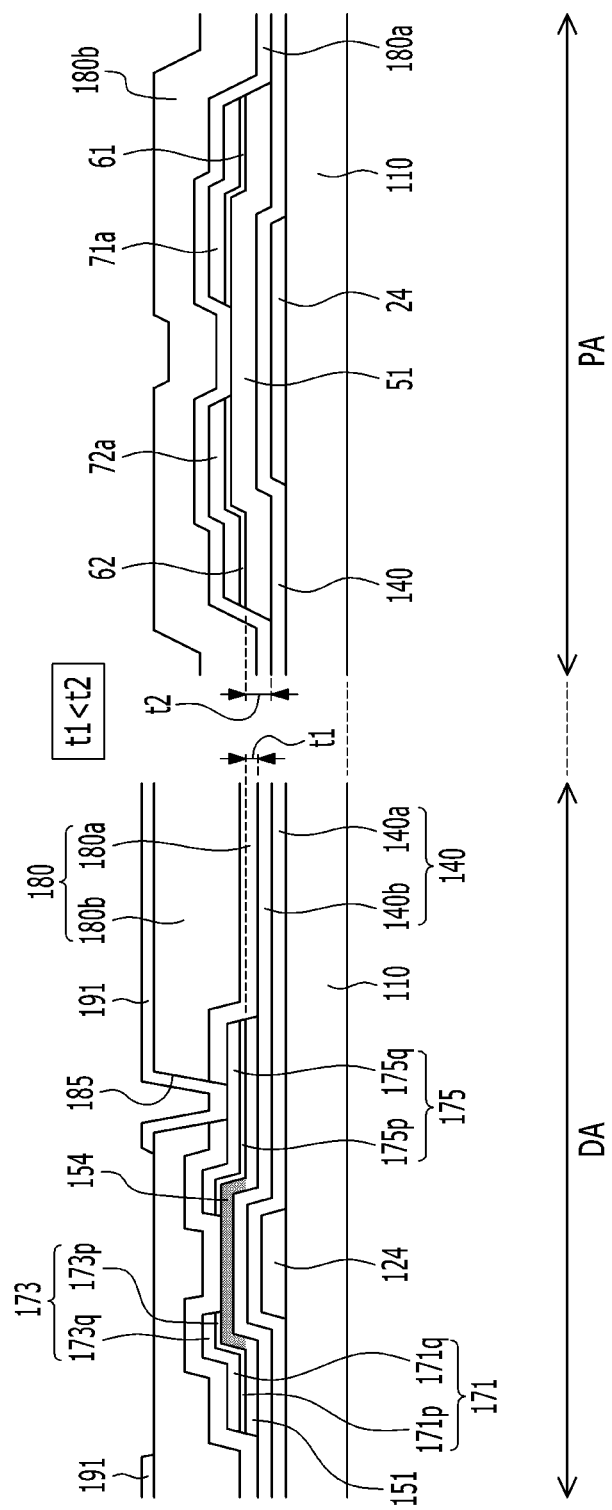
FIG. 11b shows the thin film transistor panel having the transistor disposed in the display area (DA) shown in FIG. 3 and the transistor disposed in the peripheral area (PA) shown in FIG. 8, in which a thickness $t_1$ of the first semiconductor layer is less than a thickness $t_2$ of the second semiconductor layer.
Figure 11C:
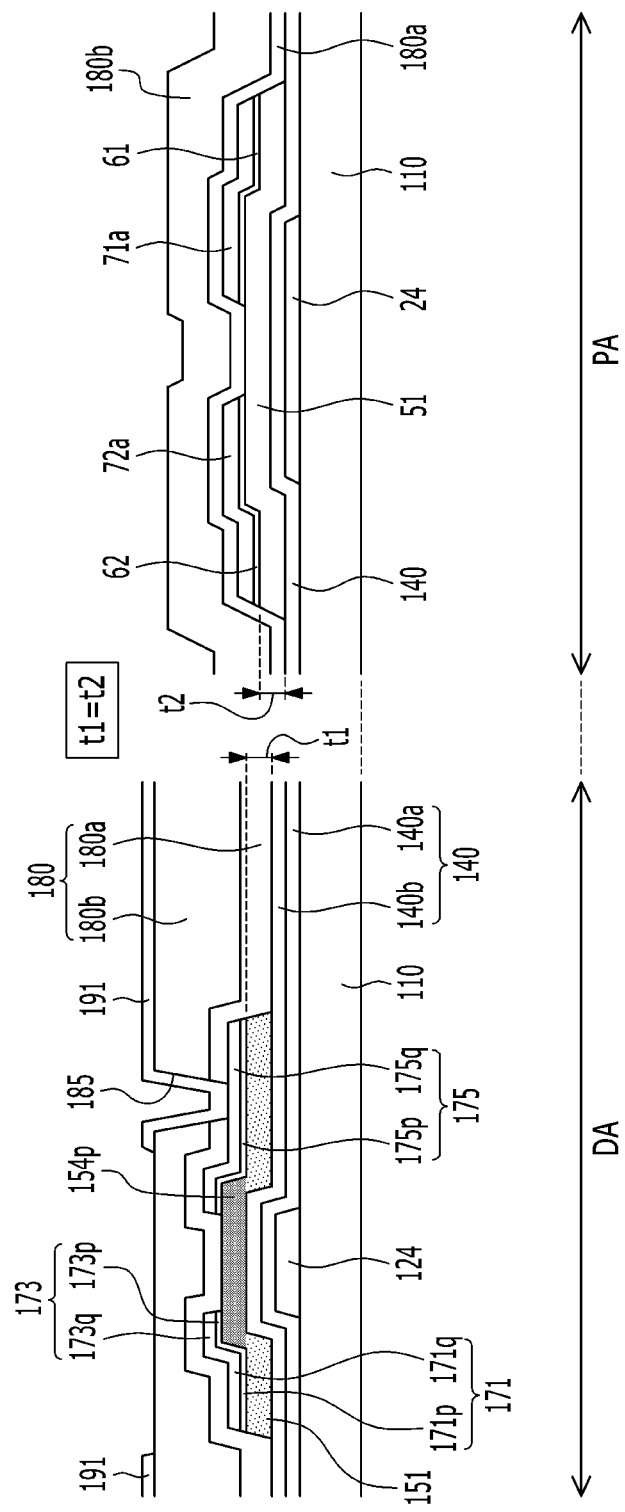
FIG. 11c shows the thin film transistor panel having the transistor disposed in the display area (DA) shown in FIG. 9 and the transistor disposed in the peripheral area (PA) shown in FIG. 10, in which a thickness $t_1$ of the first semiconductor layer is same as a thickness $t_2$ of the second semiconductor layer.

Referring to FIGS. 11a through 11c, FIG. 11a shows the thin film transistor panel having the transistor disposed in the display area (DA) shown in FIG. 3 and the transistor disposed in the peripheral area (PA) shown in FIG. 5, in which a thickness $t_1$ of the first semiconductor layer is less than a thickness $t_2$ of the second semiconductor layer. FIG. 11b shows the thin film transistor panel having the transistor disposed in the display area (DA) shown in FIG. 3 and the transistor disposed in the peripheral area (PA) shown in FIG. 8, in which a thickness $t_1$ of the first semiconductor layer is less than a thickness $t_2$ of the second semiconductor layer. FIG. 11c shows the thin film transistor panel having the transistor disposed in the display area (DA) shown in FIG. 9 and the transistor disposed in the peripheral area (PA) shown in FIG. 10, in which a thickness $t_1$ of the first semiconductor layer is same as a thickness $t_2$ of the second semiconductor layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a substrate including a display area and a peripheral area;
a first semiconductor layer disposed in the display area and a second semiconductor layer disposed on the peripheral area; and
a passivation layer disposed on the first semiconductor layer and the second semiconductor layer,
wherein the first semiconductor layer and the second semiconductor layer include an oxide semiconductor, and
wherein a thickness of the first semiconductor layer is less than that of the second semiconductor layer.

2. The thin film transistor array panel of claim 1, wherein the second semiconductor layer is disposed on a gate driver area of the peripheral area.

3. The thin film transistor array panel of claim 2, wherein the second semiconductor layer includes a lower semiconductor layer and an upper semiconductor layer disposed on the lower semiconductor layer.

4. The thin film transistor array panel of claim 3, wherein the first semiconductor layer and the upper semiconductor layer of the second semiconductor lava are disposed as a same layer.

5. The thin film transistor array panel of claim 4, wherein the first semiconductor layer and the second semiconductor layer are formed with an oxide semiconductor including at least one of indium, gallium, and zinc.

6. The thin film transistor array panel of claim 5, further comprising
a first gate electrode disposed on the substrate in the display area, and a first source electrode and a first drain electrode facing each other with respect to the first gate electrode, wherein
the first semiconductor layer is disposed between the first gate electrode and the first source electrode or between the first gate electrode and the first drain electrode.

7. The thin film transistor array panel of claim 6, flintier comprising
a second gate electrode disposed on the substrate in the peripheral area, and a second source electrode and a second drain electrode facing each other with respect to the second gate electrode, wherein
the second semiconductor layer is disposed between the second gate electrode and the second source electrode or between the second gate electrode and the second drain electrode.

8. A method for manufacturing a thin film transistor array panel, comprising:
forming a first semiconductor layer in a display area and a second semiconductor layer in a peripheral area on a substrate including the display area and the peripheral area; and
forming a passivation layer on the first semiconductor layer and the second semiconductor layer,
wherein the first semiconductor layer and the second semiconductor layer are formed with an oxide semiconductor, and
wherein a thickness of the first semiconductor layer is formed to be less than that of the second semiconductor layer.

9. The method of claim 8, further comprising:
disposing a shadow mask to correspond to the display area on the substrate;

forming a lower semiconductor material layer in the peripheral area while the shadow mask is disposed;
removing the shadow mask;
forming an upper semiconductor material layer on the lower semiconductor material layer in the peripheral area and forming a first semiconductor material layer in the display area while the shadow mask is removed; and
forming the first semiconductor layer and the second semiconductor layer by patterning the first semiconductor material layer, the upper semiconductor material layer, and the lower semiconductor material layer.

10. The method of claim 9, wherein
the second semiconductor layer is formed on a gate driver area of the peripheral area.

11. The method of claim 10, wherein
the first semiconductor layer and the upper semiconductor layer of the second semiconductor layer are formed as a same layer.

12. The method of claim 8, wherein
the forming of a first semiconductor layer and a second semiconductor layer includes:
forming the semiconductor material layer with a same thickness in the display area and the peripheral area on the substrate; and
forming the first semiconductor layer a Id the second semiconductor layer having different thicknesses by etching the semiconductor material layer.

13. The method of claim 12, wherein
the second semiconductor layer is formed on a gate driver area of the peripheral area.

14. The method of claim 8, wherein
the first semiconductor layer and the second semiconductor layer are formed with an oxide semiconductor including at least one of indium, gallium, and zinc.

* * * * *